US006696878B1

(12) United States Patent
Haskin

(10) Patent No.: US 6,696,878 B1
(45) Date of Patent: Feb. 24, 2004

(54) STACKED LEVEL SHIFTER METHOD AND APPARATUS

(75) Inventor: Bryan Haskin, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/338,470

(22) Filed: Jan. 8, 2003

(51) Int. Cl.[7] .................................. H03L 5/00
(52) U.S. Cl. ........................... 327/333; 327/55
(58) Field of Search ........................ 327/52, 54, 55, 327/65–67, 333, 563; 330/253

(56) References Cited

U.S. PATENT DOCUMENTS 6,504,405 B1 * 1/2003 Nguyen et al. ............... 327/67

* cited by examiner

Primary Examiner—Kenneth B. Wells

(57) ABSTRACT

A method and apparatus for interfacing two voltage domains is presented. In one embodiment of the present invention, a method and apparatus for interfacing a high voltage domain with a low voltage domain is presented. In one embodiment of the present invention, high output signals and low output signals are generated with a level-shifter. The level-shifter is used to interface the two domains. The low output signals are generated using a low-voltage driver and a first clipping stage. The high output signals are generated using a high-voltage driver and a second clipping stage. Duty-cycle distortion is lowered or eliminated by using an accelerator to accelerate the transition between the high output signals and the low output signals. Bias signals are input into the first and second stage. The bias signals work in a coordinated manner, to constrain the minimum and maximum outputs of various components in the level-shifter.

9 Claims, 4 Drawing Sheets

US 6,696,878 B1

STACKED LEVEL SHIFTER METHOD AND APPARATUS

BACKGROUND OF THE INVENTION

1. Field of the Invention

This invention relates to electronic systems. Specifically, the present invention relates to electronic circuits.

2. Description of the Related Art

Modern electronic systems are implemented with integrated circuits. The integrated circuits include digital logic that is implemented with analog devices, such as Field Effect Transistors (FET(s)). A conventional integrated circuit may have millions of analog devices included in one circuit.

Integrated circuits are often combined into electronic systems, such as chips or microprocessors. Chips are combined in electrical boards, which form the building blocks of many large-scale electronic systems. For example, a common computer system may include a motherboard that includes a number of microprocessors or chips, such as a central processing unit (i.e., CPU).

In order to integrate a large-scale electronic system, design requirements are established for each component so that the components work together. For example, specific types of FETs may be specified or specific voltage requirements may be established. For example, in many large-scale electronic systems, the microprocessor technology (i.e., integrated circuit) is implemented with 2.5-volt FETs. The 2.5-volt FETs offer a high degree of performance. However, technology on the board may be implemented with higher-voltage devices. For example, 3.3-volt technology is now common on boards.

In order for a large-scale electronic system to operate, signals are transferred between the integrated circuit (i.e., chip) and the board. For performance reasons, it is often desirable to implement the integrated circuit with low voltage components. As a result, the board would be implemented with high-voltage components and the chip would be implemented with low-voltage components. An interface is implemented between the chip and the board to transfer signals between the two. The interface is referred to as a pad. In the foregoing configuration, a pad would be necessary because applying high voltages (i.e., 3.3 volts) across low-voltage devices (i.e., 2.5-volt FETs) would result in the destruction of the low-voltage devices.

An example of an interface circuit, which performs level shifting, is presented in FIG. 1. In FIG. 1, a level shifter is presented as 100. The level shifter is used to shift the voltage levels between the devices found in the chip and the devices found in the board. In FIG. 1, an input voltage (e.g., Vin) is shown as 102. Input voltage Vin 102 is the voltage coming from the core side (i.e., the chip) of the architecture. The input voltage Vin 102 is applied to nFET 104. The input voltage Vin 102 is inverted using inverter 106. The inverted input voltage is applied to nFET 108. Both nFETs 104 and 108 are connected to ground 110. Two pFETs 116 and 118 are also shown. The node between nFET 104 and pFET 116 is shown as 112. The node between nFET 108 and pFET 118 is shown as 113. An output voltage (e.g., Vout) is shown as 114. A supply voltage is shown as 120.

During operation, the input voltage Vin 102 is applied to nFET 104 and the complement the input voltage Vin 102 is applied to nFET 108. As a result, when a high signal (i.e., logical 1) is placed on nFET 104, a low signal (i.e., logical 0) is placed on nFET 108. When a high signal is placed on nFET 104, nFET 104 conducts and pulls the node 112 on the drain of nFET 104 to ground 110. As a result, the pFET 118 sees ground 110 on its input and attempts to pull the node 113, located between nFET 108 and pFET 118, high. The node 113 and the output voltage Vout 114 carry the same signal or state. In addition, when there is a high signal on the gate of nFET 104, there is a low signal on the gate of nFET 108. The low signal on the gate of nFET 108 turns off nFET 108. Therefore, a low-impedance path is established between output voltage Vout 114 and the supply voltage 120. As a result, a high signal is on output voltage Vout 114 and a low signal is on the node 112, which is located between nFET 104 and pFET 116. In addition, as output voltage Vout 114 is pulled high, the gate on pFET 116 sees a high voltage that turns the pFET 116 off.

On the left-hand side of the level shifter 100, there is a FET that is on all of the time (i.e., nFET 104) and a FET that is off all of the time (i.e., pFET 116). On the right-hand side of the level shifter 100, there is also a FET that is on all of the time and a FET that is off all of the time. As a result, in the level shifter 100, a DC current does not appear between the supply voltage 120 and ground 110. One of the transistors in the pair on either side is always off and that forces output voltage Vout 114 to go to one of the rails (e.g., supply voltage 120 or ground 110).

Ultimately, in the conventional level shifter 100, there is a differential output or a complementary output that shifts the input voltage Vin 102, which is applied to the gates of nFETs 104 and 108; to a high-voltage signal that is presented at the node 113 and at the output voltage Vout 114.

It should be noted that in the design of the level shifter 100, the FETs are 2.5-volt FETs. As discussed previously, when input voltage Vin 102 is high, nFET 108 sees a low-voltage signal as an input. nFET 108 sees ground 110 as its input so output voltage Vout 114 (and node 113) is pulled high. When output voltage Vout 114 is pulled high, pFET 118 provides a low-impedance path to the supply voltage 120 (i.e., the high rail), which is 3.3 volts. As a result, output voltage Vout 114 is also at 3.3 volts. If output voltage Vout 114 is at 3.3 volts, then nFET 108 sees 3.3 volts from its source to its drain. Applying 3.3 volts from the source to the drain of nFET 108, which is a 2.5-volt FET, will cause breakdown in nFET 108.

In addition, since output voltage Vout 114 is 3.3 volts, pFET 116 sees 3.3 volts on its gate. If output voltage Vout 114 is high, node 112 is low; meaning that node 112 is at ground 110. Since output voltage Vout 114 is applied to pFET 116, you get a potential of 3.3 volts across pFET 116 from its gate (i.e., 3.3 volts) to its drain (i.e., ground). Since pFET 116 is a 2.5-volt FET, pFET 116 will experience breakdown.

Thus, there is a need in the art for a method and apparatus for transferring signals from a low-voltage environment to a high-voltage environment. There is a need in the art for a method of interfacing with a high-supply voltage when using low-voltage FETs. There is a need for a circuit design that uses low-voltage FETs, which are configured so that the low-voltage FETs do not breakdown when they are exposed to a high-voltage supply.

SUMMARY OF THE INVENTION

A method and apparatus are presented that configure low-voltage devices so that they do not experience breakdown when exposed to a high-supply voltage. In one embodiment of the present invention, low-voltage FETs are configured to produce an output. The low-voltage FETs receive a high-supply voltage. The low-voltage FETs are configured so that they will not experience breakdown when exposed to the high-supply voltage.

In one embodiment of the present invention, the method and apparatus are implemented as an interface between a high-voltage environment and a low-voltage environment. The high-voltage environment may be an electronic system, such as a motherboard, and the low-voltage supply may be an integrated circuit located on a chip, which is a component of the motherboard.

In the method and apparatus of the present invention, the low-voltage devices may be 2.5-volt FETs that are used to interface with a high-voltage supply of 3.3 volts. The 2.5-volt FETs are configured so that the FETs do not experience breakdown when they are exposed to the 3.3-volt supply. Further, the FETs are used to shift the voltage level of signals that are exiting the chip (i.e., microprocessor) and entering the high-voltage environment. Therefore, in one embodiment of the present invention, the FETs are configured in a circuit that shifts signals from 2.5 volts up to 3.3 volts for interfacing with the high-voltage environment.

In one embodiment of the present invention, a system comprises a low-voltage driver generating low-voltage signals; a high_bias circuit generating high_bias signals; a first clipping stage coupled to the low-voltage driver and coupled to the high_bias circuit, the first clipping stage generating clipped low-voltage signals in response to the low-voltage signals generated by the low-voltage driver and in response to the high_bias signals generated by the high_bias circuit; a low_bias circuit generating low_bias signals; a high-voltage driver generating high-voltage signals; a second clipping stage coupled to the high-voltage driver and coupled to the low_bias circuit, the second clipping stage generating clipped high-voltage signals in response to the high-voltage signals generated by the high-voltage driver and in response to the low_bias signals generated by the low_bias circuit; an accelerator generating acceleration signals; and an output coupled to the first clipping stage, coupled to the second clipping stage, and coupled to the accelerator, the output generating output signals in response to the clipped high-voltage signals second clipping stage, in response to the clipped low-voltage signals generated by the first clipping stage, and in response to the acceleration signals.

In another embodiment of the present invention, a level system comprises a low-voltage driver generating low-voltage signals; a first clipping stage coupled to the low-voltage driver and generating clipped low-voltage signals in response to the low-voltage signals generated by the low-voltage driver; a high-voltage driver generating high-voltage signals; a second clipping stage coupled to the high-voltage driver and generating clipped high-voltage signals in response to the high-voltage signals generated by the high-voltage driver; an accelerator generating acceleration signals; and an output coupled to the first clipping stage, coupled to the second clipping stage and coupled to the accelerator, the output generating output signals in response to the clipped high-voltage signals generated by the second clipping stage, in response to the clipped low-voltage signals generated by the first clipping stage and in response to the acceleration signals generated by the accelerator.

A system comprises a low-voltage driver generating low-voltage signals; a high-voltage driver generating high-voltage signals; a bias circuit generating bias signals; an accelerator generating acceleration signals; and a clipping stage coupled to the low-voltage driver, coupled to the high-voltage driver, coupled to the bias circuit and coupled to the accelerator, the clipping stage generating output signals in response to the high-voltage signals generated by the high-voltage driver, in response to the low-voltage signals generated by the low-voltage driver, in response to the bias signals generated by the bias circuit and in response to the acceleration signals generated by the acceleration accelerator.

DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

A method and apparatus are presented for interfacing a low-voltage environment with a high-voltage environment. In one embodiment of the present invention, an integrated circuit using low-voltage technology interfaces with an electronic system using high-voltage technology. For example, in one embodiment of the present invention, an integrated circuit using 2.5-volt FETs integrates with a system using 3.3-volt technology.

A variety of terms will be used to describe the method and apparatus of the present invention. Devices (i.e., components) or nodes will be described as being "high" or "low," "rising" or "falling," "on" or "off." The various terms refer to the voltages or signals in the devices or nodes. For example, a "high" on a node may represent a high voltage, a high signal or logical 1 on the node. A "low" on a node may represent a low voltage, a low signal or logical zero on the node. "Rising" or "falling" refers to devices going from a low to a high or from a high to a low. When a device is "on" the device is operating or conducting. When a device is "off" the device is not operating or not conducting. Since a device transitions from one condition to another, "on" and "off" may be relative terms defining the relative state of the device.

Figure 1:
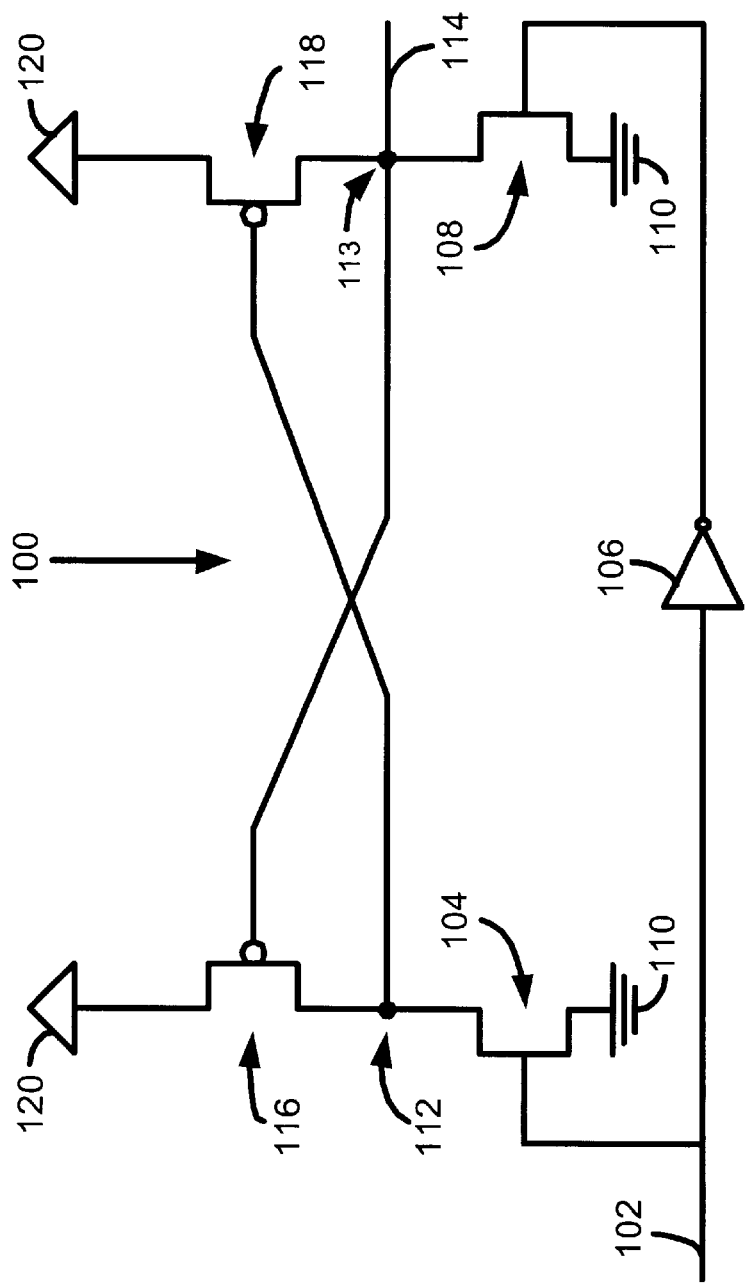
FIG. 1 displays a prior art level shifter.
Figure 2:
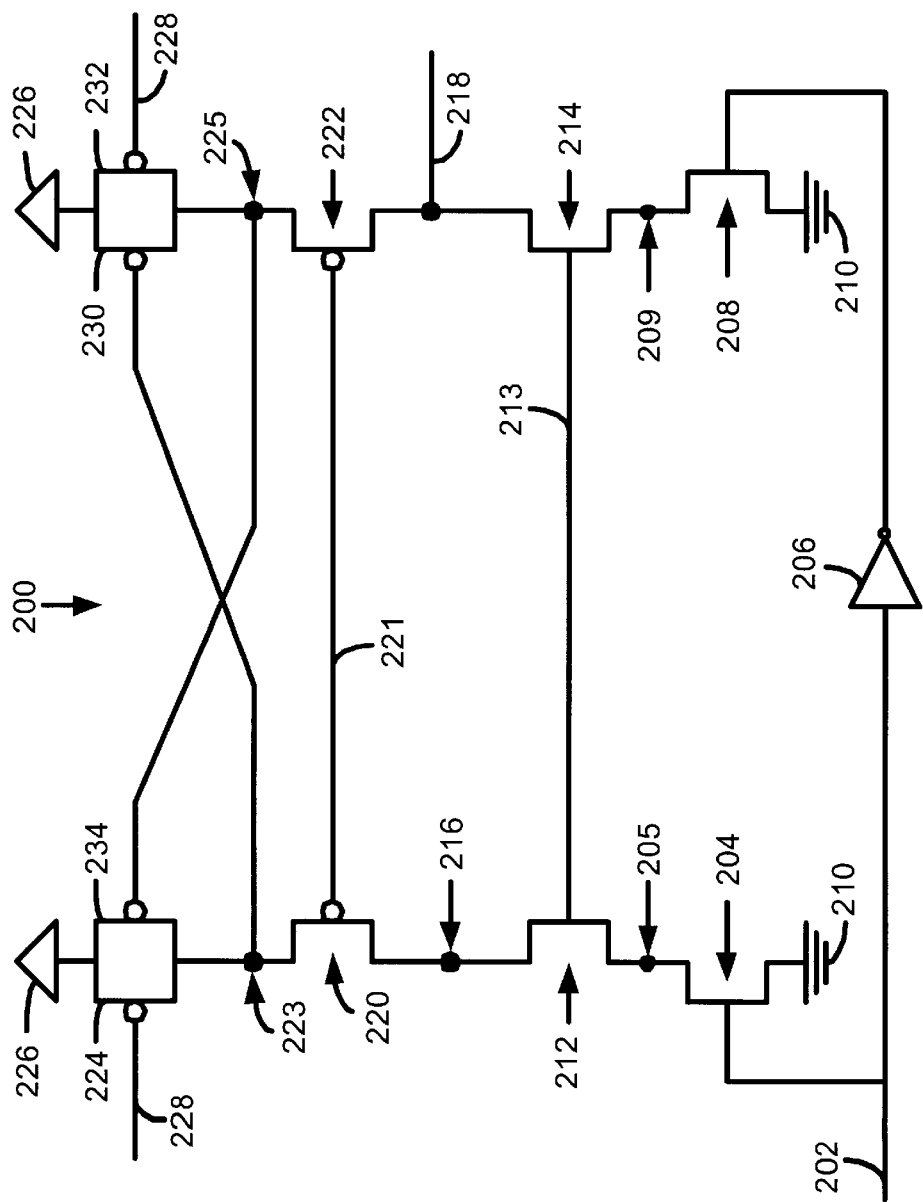
FIG. 2 displays a circuit implementing the method and apparatus of the present invention.

FIG. 2 displays one embodiment of the present invention. In FIG. 2, an input voltage is shown as Vin 202. Input voltage Vin 202 provides input to nFET 204. In addition, an inverter 206 produces an inverted input voltage Vin 202, which serves as input for nFET 208. Both nFET 204 and nFET 208 are connected to ground 210. nFET 204 is connected to nFET 212 through a node denoted as 205. In addition, nFET 208 is connected to nFET 214 through a node denoted as 209. nFET 212 and nFET 214 receive input from a high_bias signal 213. nFET 212 is further connected to pFET 220 through a node denoted as 216. nFET 214 is connected to pFET 222 through an output voltage point referred to as Vout 218. pFET 220 and pFET 222 receive input from a low_bias signal 221.

pFET 220 is connected to pFET 234 and leaky FET 224 through a node denoted as 223. pFET 222 is connected to pFET 230 and leaky FET 232 through a node denoted as 225. Both leaky FETs 224 and 232 receive a leaky FET voltage input 228. In addition, pFETs 230 and 234 and leaky FETs 224 and 232 are connected to a supply voltage shown as 226.

The high_bias signal 213 and the low_bias signal 221 are defined in the present invention. In one embodiment of the present invention, the high_bias signal 213 is defined as ¾ of the supply voltage 226. In another embodiment of the present invention, the low_bias signal 221 is defined as ¼ of the supply voltage 226.

The values of the high_bias signal 213 and low_bias signal 221 are chosen based on predefined criteria. In one embodiment of the present invention, the high_bias signal 213 and the low_bias signal 221 are chosen so that the supply voltage 226 is split evenly among the FETs (i.e., 204, 212, 220, 224, 234 or 208, 214, 222, 230, 232). For example, when output voltage Vout 218 is high, the supply voltage 226 is across nFET 214 and nFET 208. Since the high_bias signal 213 is at ¾ of the supply voltage 226, there is a threshold drop from the high_bias signal 213 to the node designated as 209 located between 214 and 208. As a result, it is advantageous that nFET 208 does not experience a value on its drain that is greater than the high_bias signal 213 minus a threshold drop across nFET 214. As a result, in one embodiment of the present invention, the voltage across the source-to-drain of nFET 208 does not exceed 2.5 volts. In addition, when output voltage Vout 218 is high and the high_bias signal 213 is low, a scenario may present itself, where all of output voltage Vout 218 is seen across nFET 214. Therefore, the high_bias signal 213 is chosen so that the voltage across node 209 will not go so high that there is too much voltage on nFET 208. In the alternative, the high_bias signal 213 is chosen so that node 209 will not go so low that there is too much voltage on nFET 214. Similar reasoning is used to select the low_bias signal 221.

In one embodiment of the present invention, a high voltage on input voltage Vin 202 would provide a high input to nFET 204. In addition, a high voltage on input voltage Vin 202 would provide a low input to nFET 208 after the high voltage on input voltage Vin 202 is processed through the inverter 206. With a high voltage on input voltage Vin 202 and a high input to nFET 204, nFET 204 provides a low-impedance path to ground 210. As a result, the node between nFET 204 and nFET 212, which is shown as node 205, will attempt to move to a low voltage (i.e., pull low).

A high input on input voltage Vin 202 would provide a low input on the gate of nFET 208. A low input on the gate of nFET 208 turns the nFET 208 off and since there is no current flowing in nFET 208, there is no current flowing in nFET 214. As a result, there is a high-impedance path looking from output voltage Vout 218 into the drain of nFET 214.

Since input voltage Vin 202 is high, a high signal is present on the gate of nFET 204. As a result, nFET 204 will attempt to conduct. nFET 204 will attempt to pull the node denoted as 209 down to ground 210. Since node 209 is at ground 210, the high_bias signal 213 is a relatively high signal input to nFET 212. In other words, the high_bias signal 213 minus the value on node 205, which is located between nFET 204 and nFET 212, is greater than the threshold of nFET 212, so there is a low impedance at nFET 212. The low impedance at nFET 212 pulls a node denoted as 216 to ground. With the node denoted as 216 at a low, the low_bias signal 221 maintains the node denoted as 223, which is located between PFET 220 and pFET 234, so that the node 223 does not drop below the low_bias signal 221 plus a threshold.

The node 223 located between PFET 220 and pFET 234, which is the low_bias signal 221 plus a threshold, is attached to the gate of pFET 230. Since the node 223 is between ground 210 and the supply voltage 226, the node 223 causes pFET 230 to turn on. Since pFET 230 is turned on, pFET 222 is also turned on and a high voltage is present on output voltage Vout 218. With pFET 230 on and pFET 222 on, the supply voltage 226 is present at output voltage Vout 218. Since pFET 230 is on, the node 225, located between pFET 230 and PFET 222, is at the supply voltage 226. Since node 225 is at the supply voltage 226 and serves as input to pFET 234, pFET 234 is turned off. Since pFET 234 is turned off, pFET 220 is turned off and there is a high-impedance path looking into the drain of pFET 220 from the node denoted as 216. As a result of this process, the level shifter 200 produces a low voltage at node 216 and the supply voltage at output voltage Vout 218.

Output voltage Vout 218 is fed into the next sequential circuit in the system. In one embodiment of the present invention, a level of tolerance is placed on the amount of duty cycle distortion. Duty cycle refers to the amount of time that the level shifter produces output voltage Vout 218 as a high value versus the amount of time that output voltage Vout 218 is a low value. In one embodiment of the present invention, the ratio of time that output voltage Vout 218 is high versus the amount of time that output voltage Vout 218 is low should be about 50 percent.

In the level shifter 200, output voltage Vout 218 will respond quickly to an input pulse (i.e., input voltage Vin 202) that drives output voltage Vout 218 low because the path that an input voltage Vin 202 has to take is shorter. In one embodiment of the present invention, a low-impedance drive path may be defined as the path taken through level shifter 200 when output voltage Vout 218 produces a low output. A high-impedance drive path may be defined as the path taken through level shifter 200 when output voltage Vout 218 produces a high output. A low-impedance drive path from input voltage Vin 202 to output voltage Vout 218 would include inverter 206, nFET 208, and nFET 214 since that is the low-impedance path for driving output voltage Vout 218 low at a specific point in time. To drive output voltage Vout 218 high (i.e., high-impedance path), the low-impedance path discussed above is turned off. Instead, a path is defined from input voltage Vin 202 through nFET 204, nFET 212, pFET 220, which impacts node 223 and turns on pFET 230. pFET 230 then turns on pFET 222, which produces a high signal at output voltage Vout 218. It is clear from the foregoing discussion that the high-impedance path is longer in terms of FETs, gate delays, and capacitance than the low-impedance path. As a result, transitioning from high to low may meet the duty-cycle constraints. However, transitioning from low to high may experience latency.

In one embodiment of the present invention, duty-cycle latency or distortion is minimized or illuminated with the use of leaky FETs 224 and 232. In one embodiment of the present invention, leaky FETS 224 and 232 are turned on all the time and function as accelerators to quicken the transitions of output voltage Vout 218.

During operation, when input voltage Vin 202 transitions to make output voltage Vout 218 go high, nFETs 208 and 214 are turned off so there is high impedance between output voltage Vout 218 and ground 210 at this point in the process. There is also a high impedance through pFET 222 and pFET 230 since the impact of the transition of input voltage Vin 202 has not worked its way through nFET 204, nFET 212, pFET 220, node 223, pFET 234, pFET 230 and pFET 222 to turn the high-impedance path on. However, using the embodiment of the present invention, as soon as nFET 208 turns off, the leaky FET 232 starts charging output voltage Vout 218. Leaky FET 232 performs preemptive charging because the leaky FET 232 is always turned on. When the duty cycle is graphed with voltage as a function of time, in one embodiment of the present invention, the voltage does not go to zero because the leaky FETs are never turned off.

In the alternative, when input voltage Vin 202 transitions high, nFET 204 turns on. Turning nFET 204 on, pulls the node denoted by 216 low. At the same time, input voltage Vin 202 transitions the devices nFET 208, nFET 214, pFET 222 and node 225 so that pFET 234 is turned off. Since the leaky FET 224 is always on and the pFET 234 is turned off, the leaky FET 224 is working against pFET 234. Since pFET 234 is turned off, a high-impedance path (i.e., pFET 234) occurs in parallel with a low impendence (i.e. leaky FET 224). A high impedance path in parallel with a low impedance path, results in a low impedance output. As a result, a drive fight occurs when trying to pull node 216 low. However, the leaky FET 224 is sized small so that the drive fight is not significant.

When pFET 234 turns on, it is a much bigger FET than leaky FET 224. When pFET 234 turns on, it provides low impedance to the supply voltage 226. As a result, leaky FET 224 helps to speed up the transition of node 216 on the high side of the transition. If input voltage Vin 202 is switched and node 216 is transitioned high (i.e., as discussed above), pFET 234 provides a low-impedance path to the supply voltage 226 and helps to drive node 216 high (i.e., upward) faster.

The components of the level-shifter include a variety of characteristics. In one embodiment of the present invention, the leaky FETs 224 and 232 are ⅕ the size of the other FETs. In addition, there is about 10 percent difference between the channel lengths of the nFETs and the pFETs. In one embodiment of the present invention, all the FETS are 2.5-volt FETs. The width/length ratio of the FETs (i.e., except leaky FETs) is one to five. In addition, various voltages may be used. For example, the supply voltage of 3.3 volts, a core voltage of 1.2 volts, and a high voltage of 2.5 volts may be implemented.

Figure 3:
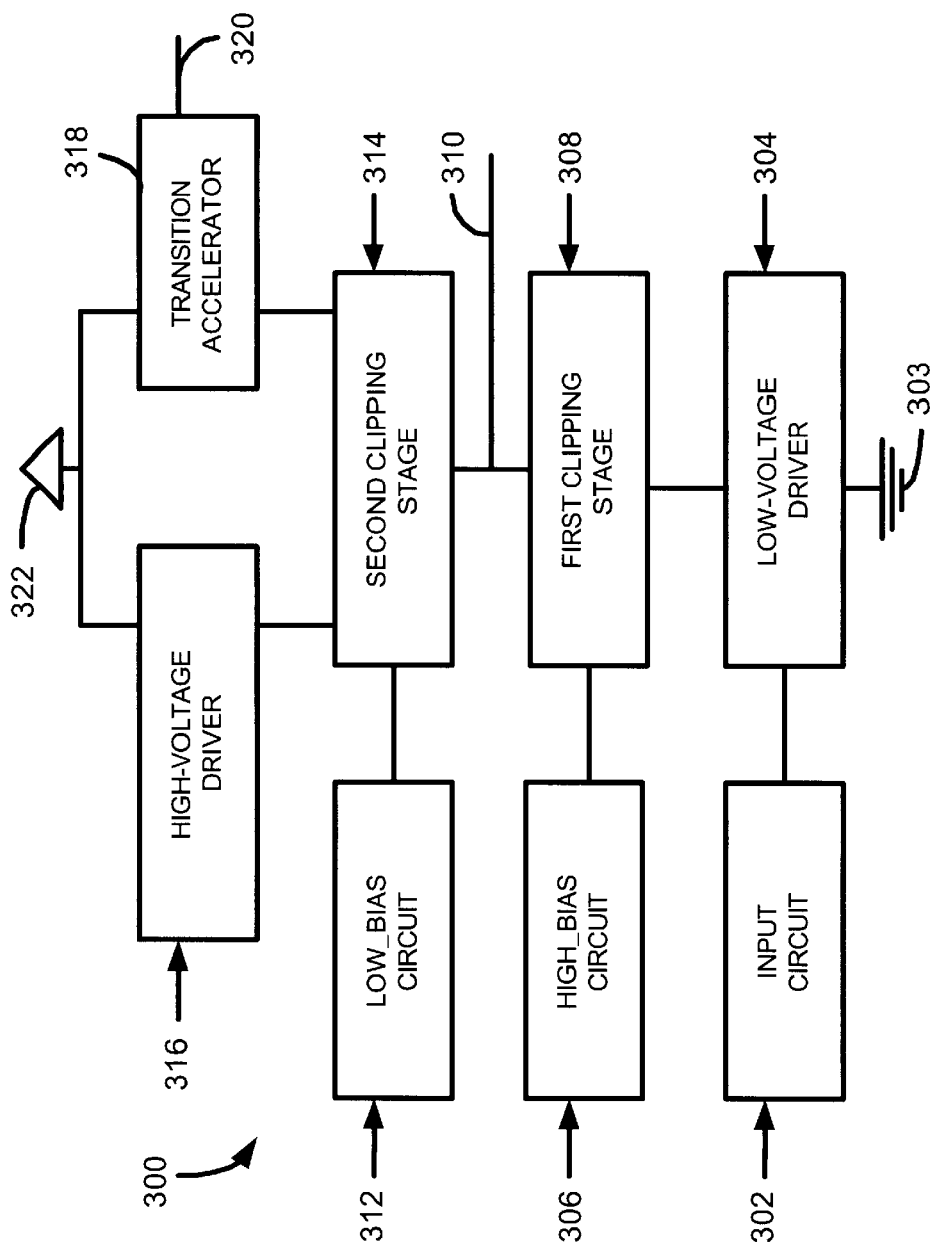
FIG. 3 displays a block diagram implementing the method and apparatus of the present invention.

FIG. 3 displays a block diagram representation of the stacked-level shifter presented in FIG. 2. In FIG. 3, a stacked-level shifter 300 is shown as a system. The stacked-level shifter 300 includes an input circuit 302. The input circuit 302 generates an input voltage or Vin. The input voltage may be high (i.e., logical 1) or may be low (i.e., logical 0). The input circuit 302 provides input to a low-voltage driver 304. The low-voltage driver 304 is coupled to ground 303. The low-voltage driver 304 controls low-voltage operation of the stacked-level shifter 300. The low-voltage driver 304 generates low-voltage information that results in a low-voltage output at an output node shown as 310.

A high_bias circuit 306 is defined in the present invention. In one embodiment of the present invention, the high_bias circuit 306 generates a voltage that is ¾ of the supply voltage 322. The high_bias circuit 306 provides high_bias signals to a first clipping stage 308. The first clipping stage 308 clips the signal coming out of the low-voltage driver 304. In one embodiment of the present invention, the combination of the high_bias signal generated by the high_bias circuit 306 and the low-voltage signal generated by the low-voltage driver 304 enables the first clipping stage 308 to generate an output signal (i.e., clipped low-voltage signals) that remains below a predefined threshold.

A supply voltage is shown as 322. The supply voltage 322 provides input to a high-voltage driver 316. The high-voltage driver 316 generates high-voltage signals. The high-voltage signals serve as input to a second clipping stage 314. A low_bias circuit 312 generates low_bias signals. The low_bias signals serve as input to the second clipping stage 314. The combination of the high-voltage signals and the low_bias signals enable the second clipping stage 314 to produce and output signal (i.e., clipped high-voltage signals) that remains above a predefined threshold.

The high-voltage driver 316 drives high-voltage signals to output 310 and the low-voltage driver 304 drives low-voltage signals to output 310. Input circuit 302 ultimately impacts the low-voltage signals generated by low-voltage driver 304 and the high-voltage signals generated by high-voltage driver 316.

A transition accelerator 318 is shown. In one embodiment of the present invention, the transition accelerator 318 receives a 2.5-volt signal 320 as input. The transition accelerator 318 accelerates the performance of the high-voltage driver 316 and the low-voltage driver 304. The transition accelerator 318 compensates for circuit delays (e.g., capacitance delay, transition through gates, etc.) when the input circuit 302 transitions from one signal to another signal. For example, when the input circuit 302 transitions from a high signal to a low signal or when input circuit 302 transitions from a low signal to a high signal.

In one embodiment of the present invention, the stacked-level shifter, shown as 300 of FIG. 3, may be implemented by the level shifter, shown as 200 of FIG. 2. Ground as shown by 210 in FIG. 2 is shown in FIG. 3 as 303. In addition, the supply voltage shown as 226 in FIG. 2 is shown as 322 in FIG. 3.

In one embodiment of the present invention, the input voltage Vin 202 may be generated by the input circuit 302 of FIG. 3. The low-voltage driver 304 of FIG. 3 may be implemented with nFET 204 and nFET 208 of FIG. 2. The first clipping stage 308 of FIG. 3 may be implemented with nFET 212 and nFET 214 of FIG. 2. The second clipping stage 314 of FIG. 3 may be implemented with pFET 220 and pFET 222 of FIG. 2. The high-voltage driver 316 of FIG. 3 may be implemented with pFET 234 and pFET 230 of FIG. 2. The transition accelerator 318 of FIG. 3 may be implemented with leaky FETs 224 and 232 of FIG. 2. The high_bias circuit 306 of FIG. 3 may generate the high_bias signal 213 of FIG. 2 and the low_bias circuit 312 of FIG. 3 may generate the low_bias signal 221 of FIG. 2. Lastly, the accelerator voltage input 320 of FIG. 3 may be implemented with the leaky FET voltage input 228 of FIG. 2.

Figure 4:
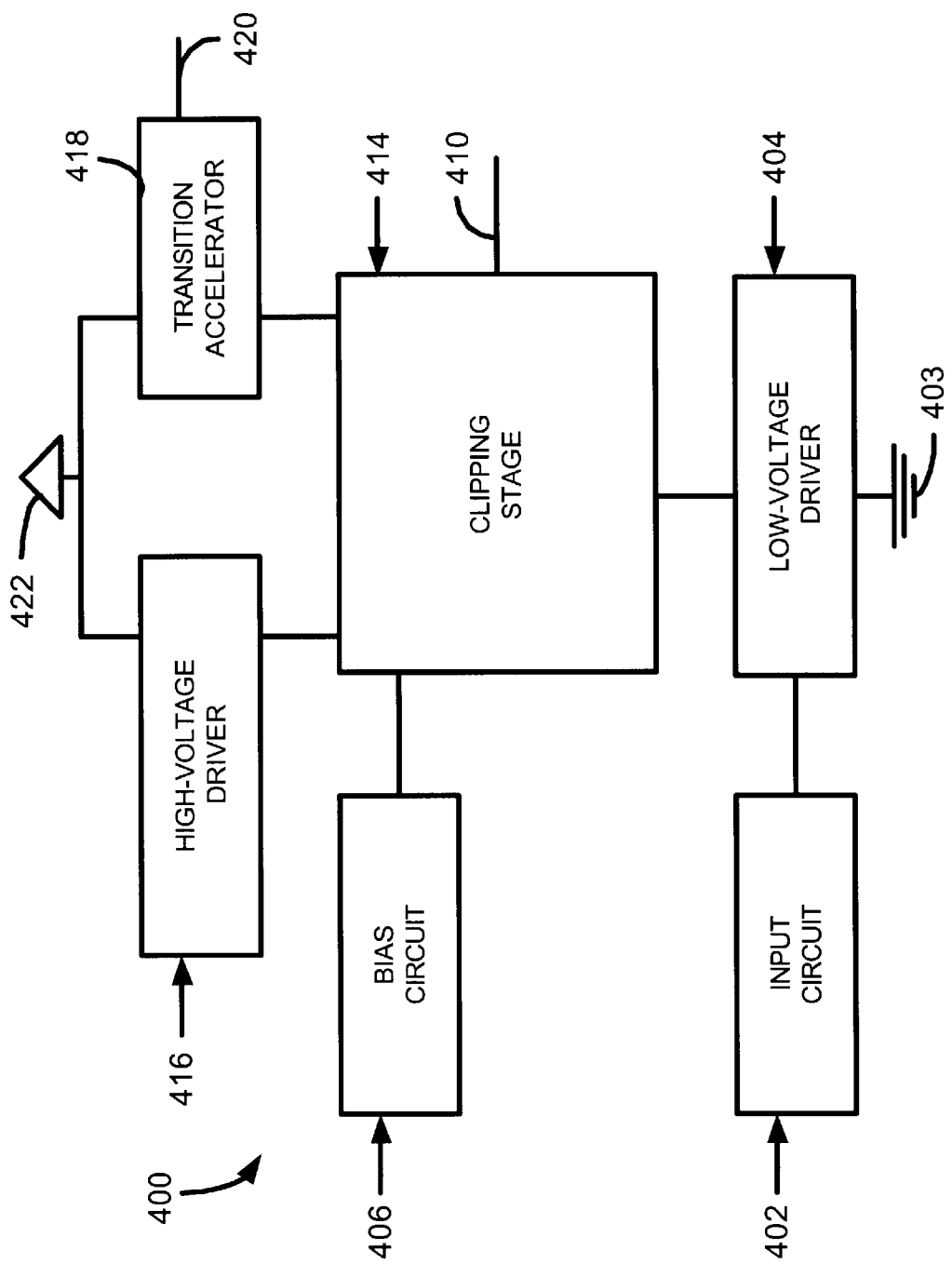
FIG. 4 displays a block diagram of an alternate embodiment of the present invention.

An alternate embodiment of a level shifter implemented in accordance with the teachings of the present invention is shown in FIG. 4. In FIG. 4, an alternate embodiment of a stacked-level shifter 400 is shown as a system. The stacked-level shifter 400 includes an input circuit 402. The input circuit 402 generates an input voltage or Vin. The input voltage may be high (i.e., logical 1) or may be low (i.e., logical 0). The input circuit 402 provides input to a low-voltage driver 404. The low-voltage driver 404 is coupled to ground 403. The low-voltage driver 404 controls low-voltage operations of the stacked-level shifter 400. The low-voltage driver 404 generates low-voltage signals, which result in a low-voltage output at Vout 410.

A bias circuit 406 is defined in the present invention. In one embodiment of the present invention, the bias circuit 406 produces a variety of bias signals. For example, the bias circuit 406 generates a high_bias signal and a low_bias signal. In one embodiment of the present invention, the high_bias signal is ¾ of the supply voltage 422 and the low_bias signal is ¼ of the supply voltage 422. The bias circuit 406 provides bias signals to a clipping stage 414. The clipping stage 414 clips the signal coming out of the low-voltage driver 404. The combination of the high_bias signal generated by the bias circuit 406 and the low-voltage signal generated by the low-voltage driver 404 enables the clipping stage 414 to generate an output signal (i.e., clipped low-voltage signal) that remains outside of predefined thresholds.

A supply voltage is shown as 422. The supply voltage 422 provides input to a high-voltage driver 416. The high-voltage driver 416 generates high-voltage signals and controls high-voltage output at Vout 410. The high-voltage signals provide input to a clipping stage 414. The bias circuit 406 generates a low_bias signal. The low_bias signal in combination with the high-voltage signals produces a Vout 410 that never drops below a predefined threshold.

A transition accelerator 418 is shown. In one embodiment of the present invention, the transition accelerator 418 receives a 2.5-volt signal 420 as input. The transition accelerator 418 accelerates the performance of the high-voltage driver 416 and the low-voltage driver 404. The transition accelerator 418 compensates for circuit delays (e.g., capacitance delay, transition through gates, etc.) when the input circuit 402 switches from one signal to another signal. For example, when the input circuit 402 switches from a high signal to a low signal or when input circuit 402 switches from a low signal to a high signal.

Thus, the present invention has been described herein with reference to a specific embodiment for a particular application. Those having ordinary skill in the art and access to the present teachings will recognize additional modifications, applications, and embodiments within the scope thereof.

It is, therefore, intended by the appended claims to cover any and all such applications, modifications, and embodiments within the scope of the present invention.

What is claimed is:

1. A system comprising:

a low voltage driver generating low voltage signals;

a first clipping stage coupled to the low voltage driver and generating clipped low voltage signals in response to the low voltage signals generated by the low voltage driver;

a high voltage driver generating high voltage signals;

a second clipping stage coupled to the high voltage driver and generating clipped high voltage signals in response to the high voltage signals generated by the high voltage driver;

an accelerator generating acceleration signals; and an output coupled to the first clipping stage, coupled to the second clipping stage and coupled to the accelerator, the output generating output signals in response to the clipped low voltage signals generated by the first clipping stage, in response to the clipped high voltage signals generated by the second clipping stage and in response to the acceleration signals generated by the accelerator.

2. A system as set forth in claim 1, wherein the low voltage driver is implemented with at least one nFET.

3. A system as set forth in claim 1, wherein the high voltage driver is implemented with at least one pFET.

4. A system as set forth in claim 1, wherein the transition accelerator is implemented with at least one nFET.

5. A system as set forth in claim 1, the system further comprising a high bias circuit generating high bias signals, the first clipping stage coupled to the high bias circuit and generating the clipped low voltage signals in response to the high bias signals generated by the high bias circuit and in response to the low voltage signals generated by the low voltage driver.

6. A system as set forth in claim 1, the system further comprising a low bias circuit generating low bias signals, the second clipping stage coupled to the low bias circuit and generating the clipped high voltage signals in response to the low bias signals generated by the low bias circuit and in response to the high voltage signals generated by the high voltage driver.

7. A system comprising:

a low voltage driver generating low voltage signals;

a high voltage driver generating high voltage signals;

a bias circuit generating bias signals;

an accelerator generating acceleration signals; and a clipping stage coupled to the low voltage driver, coupled to the high voltage driver, coupled to the bias circuit and coupled to the accelerator, the clipping stage generating output signals in response to the high voltage signals generated by the high voltage driver, in response to the low voltage signals generated by the low voltage driver, in response to the bias signals generated by the bias circuit and in response to the acceleration signals generated by the accelerator.

8. A method of operating a system comprising the steps of:

generating low voltage signals;

generating high voltage signals;

generating bias signals;

generating acceleration signals; and generating output signals in response to the high voltage signals, in response to the low voltage signals, in response to the bias signals and in response to the acceleration signals.

9. A system comprising:

means for generating low voltage signals;

means for generating high voltage signals;

means for generating bias signals;

means for generating acceleration signals; and means for generating output signals in response to the high voltage signals, in response to the low voltage signals, in response to the bias signals and in response to the acceleration signals.

* * * * *